(12) United States Patent
Fiat

(10) Patent No.: US 6,294,914 B1
(45) Date of Patent: Sep. 25, 2001

(54) METHOD OF ENHANCING AN MRI SIGNAL

(75) Inventor: Daniel Fiat, Oak Park, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 08/922,895

(22) Filed: Sep. 3, 1997

Related U.S. Application Data

(63) Continuation-in-part of application No. 08/811,346, filed on Mar. 4, 1997, which is a continuation of application No. 08/623,667, filed on Mar. 26, 1996, now Pat. No. 5,675,254, which is a continuation of application No. 08/501,888, filed on Jul. 13, 1995, now abandoned, which is a continuation of application No. 08/105,419, filed on Aug. 12, 1993, now abandoned, which is a continuation-in-part of application No. 08/071,582, filed on Jun. 2, 1993, now Pat. No. 5,433,196.

(51) Int. Cl.⁷ ........................................................ G01V 3/00
(52) U.S. Cl. ............................................ 324/312; 324/307
(58) Field of Search ............................... 324/307, 309, 324/311, 312, 314

(56) References Cited

U.S. PATENT DOCUMENTS

| 4,959,612 | * | 9/1990 | Luyten ................................. 324/311 |
| 4,987,369 | * | 1/1991 | Van Stapele et al. ............... 324/307 |
| 5,677,628 | * | 10/1997 | Watanabe et al. .................. 324/309 |

* cited by examiner

Primary Examiner—Louis Arana
(74) Attorney, Agent, or Firm—Welsh & Katz, Ltd.

(57) ABSTRACT

A method and apparatus are provided for enhancing a signal quality from a first atom of a pair of spin-spin coupled atoms, in a magnetic resonance imaging system. The method includes the steps of exciting the first atom of the pair of spin-spin coupled atoms within the magnetic resonance imaging system at a Larmor frequency of the first atom and exciting the second atom at the Larmor frequency of the second atom. The method further includes the step of detecting a signal from the first atom.

28 Claims, 10 Drawing Sheets

FIG. 6
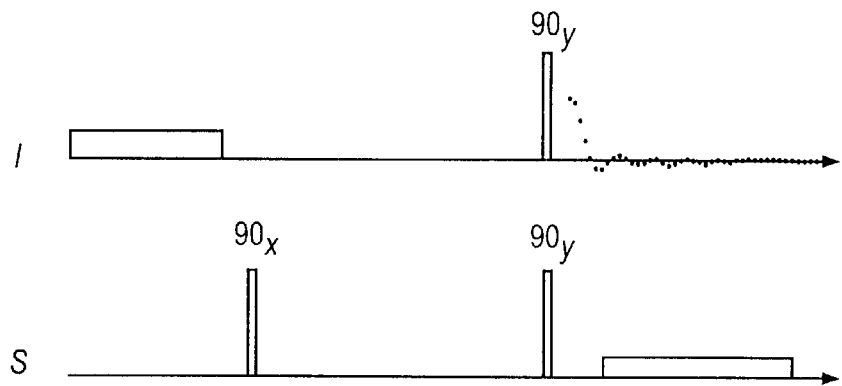
FIG. 7
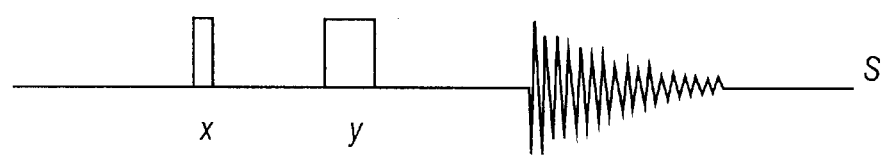
(a)

| FIG. 9a | FIG. 9b | FIG. 9c |
|---|---|---|
|  | 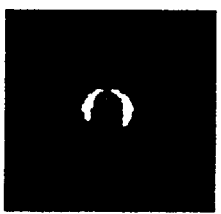 |  |
| FIG. 9d | FIG. 9e | FIG. 9f |
|  |  |  |

METHOD OF ENHANCING AN MRI SIGNAL

BACKGROUND OF THE INVENTION

This is a continuation-in-part of U.S. Ser. No. 08/811,346, filed Mar. 4, 1997, which is a continuation of U.S. Ser. No. 08/623,667 filed Mar. 26, 1996, now Pat. No. 5,675,254 which is a continuation of U.S. Ser. No. 08/501,888 filed Jul. 13, 1995, now abandoned which is a continuation of U.S. Ser. No. 08/105,419 filed Aug. 12, 1993, now abandoned entitled "DOUBLE-RESONANCE NMR COIL", which is a continuation-in-part of U.S. Ser. No. 08/071,582 (now U.S. Pat. No. 5,433,196), entitled "Oxygen-17 NMR Spectroscopy and Imaging in the Human," filed Jun. 2, 1993.

FIELD OF THE INVENTION

The field of the invention relates to magnetic resonance spectroscopy (MRS) and more particularly to magnetic resonant imaging (MRI).

MRS and MRI systems are known. Both are systems which are capable of measuring a quantity of a particular atom in other larger structures, such as a test tube or the human body. MRS is typically devoted to detecting a spectral distribution of resonance frequencies of a particular atom. MRI possesses the additional capability of combining a series of measurements to create an image of the distribution and quantity of the measured atom.

Both MRS and MRI rely on externally generated magnetic fields for purposes of aligning a nuclei of a particular atom of interest. The aligned atoms of MRS and MRI systems are subjected to a pulse of radio frequency (rf) energy, which radio frequency may be absorbed only by the nuclei of the atom of interest. Following the pulse, the radio frequency energy may be absorbed and emitted by the nuclei of the atom. Rf receivers placed close to the test sample look for and measure a level of the released energy, the magnitude of which release provides a measure of the quantity of the atoms of interest present.

The frequency at which a nuclei of an atom will absorb energy is referred to as its resonant frequency. At its resonance frequency, a nuclei of an atom may simultaneously absorb and emit energy.

The frequency at which an atom will resonate depends upon the type of atom and upon the magnetic field to which the atom is subjected. The resonant frequency within a particular magnetic field is referred to as the atom's Larmor frequency.

One atom that is of particular usefulness in MRS and MRI is hydrogen. At a magnetic field of 1.5 Gauss, hydrogen is known to have a Larmor frequency of approximately 64 MHZ. Hydrogen has a relatively large nuclear magnetic moment. It also has a relatively large concentration in humans. These two factors have made hydrogen a relatively important element in magnetic resonant imaging.

In creating images, a set of gradient coils are typically used to create a magnetic gradient across an imaging field of the MRI system. The gradient is important because it also creates a gradient in the Larmor frequencies of atoms lying within the imaging fields. With a prior knowledge of the magnetic gradient, a MRI operator can select a frequency of the rf pulse for a particular location within the imaging field knowing that only atoms at that location within the magnetic field would have the Larmor frequency which would resonate at the selected frequency.

While hydrogen is an important imaging element, it is not an element directly related to oxidative metabolism. Oxygen is an element more closely related to metabolism, but which is much harder to detect than hydrogen. Hydrogen is known to have a magnetic moment over 7 times larger than oxygen. Further, as a result of metabolism, oxygen becomes combined with hydrogen to produce a water molecule which further complicates detecting oxidative metabolism by hydrogen MRI. Accordingly, a need exists for a means of detecting oxygen which is not effected by the molecular status of the oxygen.

SUMMARY OF THE INVENTION

A method and apparatus are provided for enhancing a signal quality from a first atom of a pair of spin-spin coupled atoms, in a magnetic resonance imaging system. The method includes the steps of exciting the first atom of the pair of spin-spin coupled atoms within the magnetic resonance imaging system at a Larmor frequency of the first atom and exciting the second atom at the Larmor frequency of the second atom. The method further includes the step of detecting a signal from the first atom.

BRIEF DESCRIPTION OF THE DRAWINGS

FIG. 6 depicts a hydrogen INEPT imaging sequence used by the system of FIG. 1;

FIG. 7 depicts an DEPT imaging sequence used by the system of FIG. 1;

FIGS. 9a–f depict images generated both with and without molecular decoupling;

DETAILED DESCRIPTION OF AN EMBODIMENT

Figure 1:
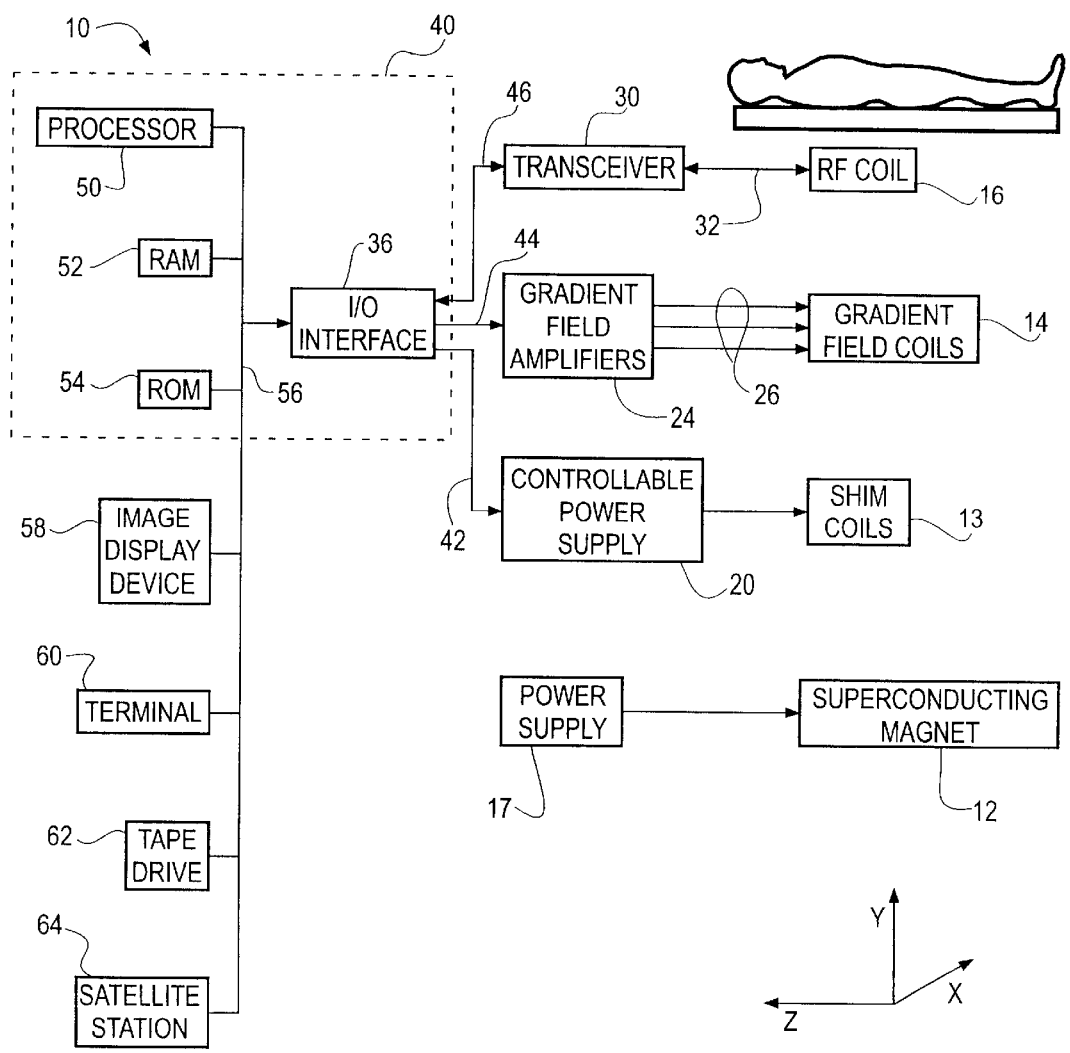
FIG. 1 depicts a block diagram of a magnetic resonance spectroscopy and imaging system.
Figure 2:
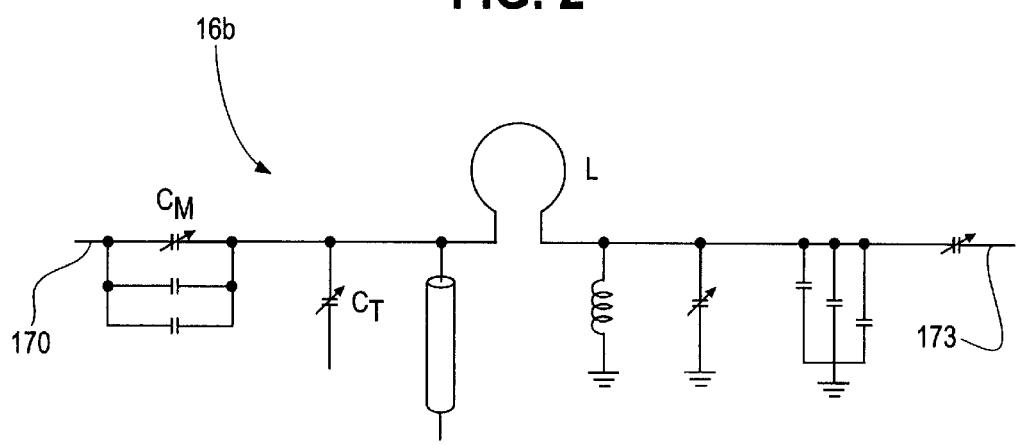
FIG. 2 depicts a schematic of a double ended coil of the system of FIG. 1.

FIG. 1 is a block diagram of a magnetic resonance imaging (MRI) and magnetic resonance spectroscopy (MRS) system 10 in accordance with an embodiment of the invention. Under the embodiment a double ended coil 16b (FIG. 2) may be used with the system 10 to simultaneously or sequentially excite one or more types of atoms and to detect a signal generated by the resonance of the one or more types of atoms.

A static magnetic field of 1.5 Tesla may be generated around a subject (e.g., a human body, test specimen, etc.)

shown in FIG. 1. An MRI excitation sequence may be applied to one or both sides of the double coil 16b to excite a first and second atom. Where two excitation sequences are applied simultaneously, two coils 16 at right angles may be used to apply the excitation sequence.

Alternatively, a volume coil may be used where necessary. Such volume coil may be made up of two concentric bird cage coils. An outer coil may be tuned to a first frequency (e.g., hydrogen-1) and an inner coil tuned to a second frequency (e.g., oxygen-17). The legs of the hydrogen and oxygen coils may be shifted one from another. The hydrogen coil may consist of 16 loops (legs), and the oxygen coil may include 8 legs. The legs may be formed from copper rods or copper foil disposed around a plastic cylinder. The coils may be inductively coupled to an exciting rf field. Coupling of the coil to the rf power supply may be achieved by having the exciting coils of the power supply (which are inductively coupled to the main coils 16) orthogonal to each other, to allow both simultaneous and sequential double irradiation as the generated rf fields are also perpendicular to each other.

A multi-planar gradient (MPGR) excitation sequence (FIG. 3) may be used to generate oxygen-17 images using the system 10 of FIG. 1. Where a static field of 1.5 Tesla is used, a Larmor frequency for excitation of oxygen-17 would be in the area of 8.66 MHZ, using the familiar Larmor equation, $f=H\gamma/2\pi$, where H is the magnitude of the static magnetic field and $\gamma$ is the gyromagnetic ratio of the isotope to be magnetically resonated.

Alternatively, projection reconstruction of hard pulses where the free induction decay (FID) is detected (i.e., not the echo of MPGR) has provided a very efficient method of enhancing and significantly improving the signal to noise ratio. The reason is that the oxygen-17 relaxation times are short and a significant part of the signal is lost when echo methods such as MPGR are used. This loss is eliminated where the projection reconstruction method and detection of FID is used.

Figure 3:
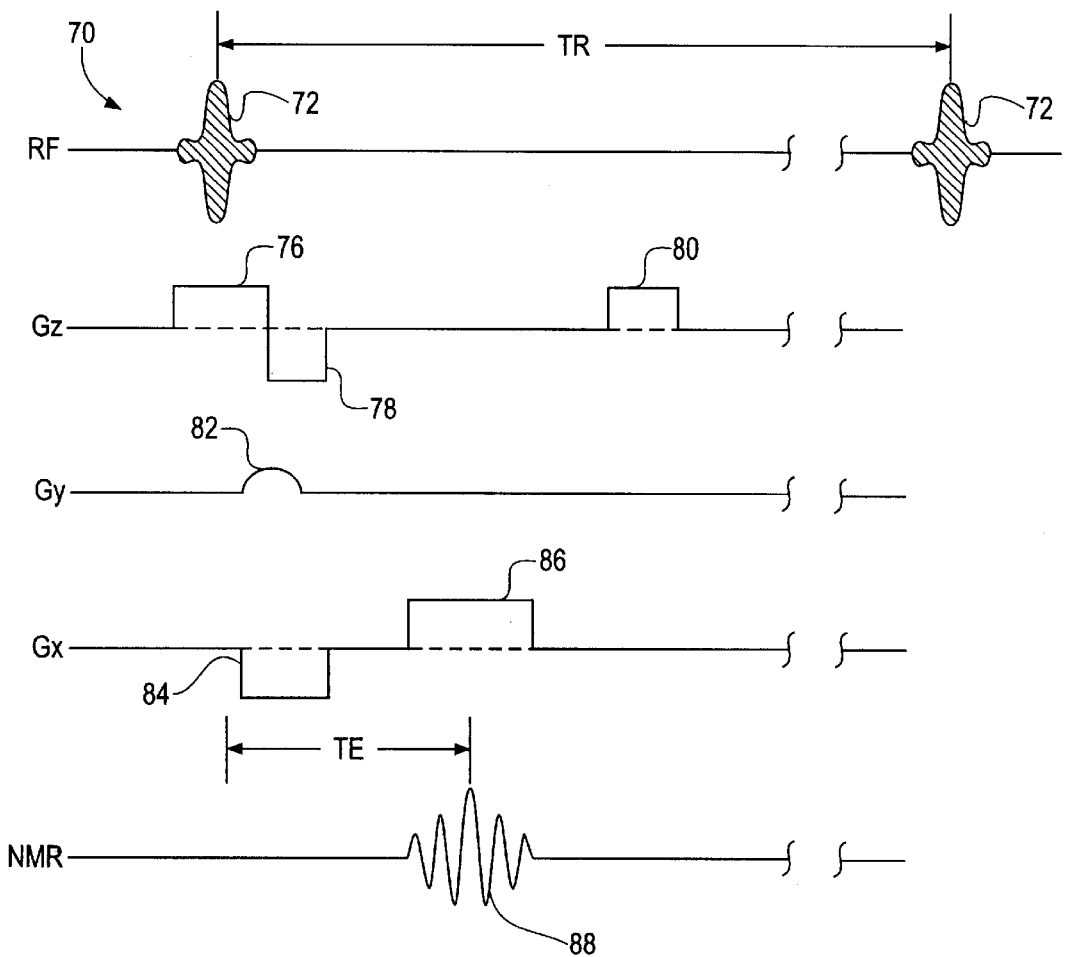
FIG. 3 depicts an imaging sequence used by the system of FIG. 1.

Referring to the excitation sequence of FIG. 3, a hermitian pulse 72 may be generated by the transmitter portion of the transceiver 30. Field gradients $G_x$, $G_y$, $G_z$ may be generated by the gradient field amplifiers 24 via the three lines 26. A resonance signal 88 may be detected by the receiver portion of the transceiver 30.

While an oxygen-17 excitation sequence is applied to a first input of the double coil 16b, a second excitation sequence for a second atom (e.g., hydrogen-1 may be applied to a second input of the double coil 16b. Such imaging sequences and associated image detection and display may be accomplished generally as described in parent U.S. Pat. No. 5,433,196, incorporated herein by reference.

Under the embodiment, it has been determined that the application of certain excitation sequences to multiple atoms can substantially enhance the resolution and information content of images generated thereunder. For instance, a molecule containing a pair of spin-spin coupled atoms can be subjected to a first and second excitation sequence that has the effect of decoupling the pair of atoms, with a dramatic improvement in a resonant signal level from one or both of the atoms.

A water molecule containing an oxygen-17 atom and two hydrogen atoms is an example of such a molecule. The oxygen-17 and one of the hydrogen atoms (e.g., $^1$H-$^{17}$O) may be considered a pair of spin-spin coupled atoms. The pair of atoms H-$^{17}$O has a magnetic moment. The magnetic moment of the pair of atoms H-$^{17}$O is dependent upon the magnetic moment (U) and spin (I) of each atom of the pair of atoms. For example, hydrogen may have spin values (I) of +1/2 and −1/2. Oxygen-17 has six possible spin values (e.g., 5/2, 3/2, 1/2, −1/2, −3/2, −5/2). Where the magnetic moment of the hydrogen atom is aligned in the same direction as the oxygen-17 atom, the magnetic moment of the pair of atoms is additive depending upon the signs of the gyromagnetic ratios. Where the magnetic moment of the hydrogen is in the opposite direction, the overall magnetic moment of the pair of atoms is equal to the difference.

The various combinations of spin values for each atom has been found to effect the gyromagnetic ratio $\gamma$ for each atom of the pair of atoms. Since the gyromagnetic ratio $\gamma$ varies, so does the Larmor frequency. For instance, it has been found that the Larmor frequency for oxygen-17 varies by as much as 90 Hz depending on whether the hydrogen atom has plus or minus spin values.

It has been found that the resonant level of a test sample can be enhanced by decoupling the pair of atoms of the spin-spin combination. Decoupling can be accomplished by any of a number of mechanisms. For instance, decoupling can be accomplished by varying the acidity/alkalinity (i.e., the pH) of the medium containing the molecule of the pair of atoms. It has been further found that the level of decoupling and resonant signal level provides a measure of the pH. Since MRI signal detection is intentionally localized to predetermined locations, the detection of localized signal enhancement allows the invention to be used to create images of pH values within test samples (e.g., within the brain of a test subject in vivo and/or in vitro).

It has also been found that decoupling may also be accomplished by irradiating the non-imaged atom of the pair of atoms to be imaged. For example, irradiating hydrogen causes spin transitions between values of +1/2 and −1/2. The actual mechanism of decoupling may be by disassociation (e.g., due to radiation, pH, etc.) or due to the application of rf energy at the Larmor frequency of hydrogen.

Where decoupling is accomplished by rf energy, a first pulse, of energy may be applied to the oxygen-17 at the Larmor frequency of oxygen-17 through a first side of the double ended coil 16b. At the end of the first pulse, a second pulse of rf energy at the Larmor frequency of hydrogen may be applied to the second end of the coil 16b at the end of the first pulse, decoupling the hydrogen from the oxygen. Alternatively, the first and second pulses may be applied simultaneously.

Once the first and second atoms have been decoupled, a resonant signal from either atom may be used for imaging. Alternatively, signals from both atoms may be collected simultaneously and images may be provided either separately, or as a composite.

Decoupling of the first and second atoms may be accomplished using rf under a number of different methods. One method involves the use of a broadband signal. For instance, a hard pulse of short duration (e.g., 100 $\mu$s) may be applied to the first atom (e.g., oxygen-17) followed by detection of the free induction decay (FID). The duration of the pulse determines the spectral width covered by the pulse (around the Larmor frequency). Shortly after the pulse the FID signal is digitized and stored in a computer as a function of time. The pulses are repeated for a variety of magnetic field gradient directions in such a way as to span the image space. The data acquired along the different projections is Fourier transformed from the time domain to the frequency domain. From the signal intensities as a function of frequency for each projection, the intensities as a function of frequency are calculated for each pixel and voxel to yield the final image.

During the excitation and/or acquisition of the signal from the first atom, the nuclei of the second atom (e.g., hydrogen) is irradiated. The irradiation of the nuclei of the second atom decouples the second atom from the first atom of the molecule by inducing fast spin transitions in the nuclei of the second atom. As a result the broad frequency domain line which envelopes the distribution of resonant frequencies due to the coupling with the second atom is eliminated and consequently a signal with a narrower Fourier transform and a higher amplitude is produced. The area under the Fourier transformed line is proportional to the number of oxygen-17 nuclei which remain constant and therefore the decrease in the line width of the signal is followed by a proportional increase in the intensity of the detected signal. The increase in the detected signal intensity results in signal enhancement and a dramatic improvement in a signal to noise ratio (S/N).

Alternatively, a slice selective pulse (e.g., as a synch or hermitian pulse) may be used for irradiating the first atom. The slice selective pulse is much longer than the hard pulse and is typically 3 msec in duration and consists of 2 or 3 lobes of different amplitude. The slice selective pulses are provided for different orientations of the magnetic field gradients. The time dependence of the FID is Fourier transformed to yield the frequency dependence of the signal intensity. From the Fourier transformed signal intensity as a function of frequency for each gradient field orientation, the spatial intensity of the signal from each slice is calculated. Three magnetic field gradients are applied. One determines the slice position and the other two the spatial position within the slice.

During the excitation and/or acquisition of the first atom, the second atom is irradiated. The irradiation of the second atom decouples the second atom from the first atom of the molecule by inducing fast spin transitions in the second atom. As a result, the broadening of the first atom frequency line width due to the coupling with the second atom is reduced and consequently a narrower Fourier transformed signal with a higher amplitude results. The area under the Fourier transformed signal is proportional to the number of first atom nuclei which remains constant and therefore the decrease in the line width is followed by a similar increase in the signal height. The increase in the signal height results in the signal enhancement and S/N.

Figure 4:
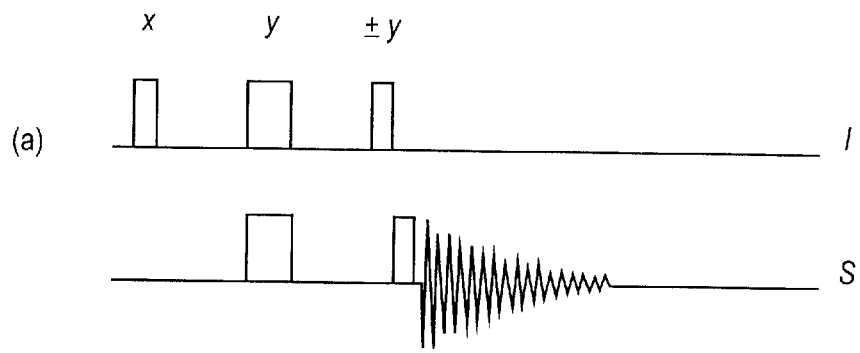
FIG. 4 depicts an INEPT imaging sequence used by the system of FIG. 1.

Decoupling can also be accomplished using polarization (magnetization) methods. FIG. 4 depicts a MRI sequence using the Insensitive Nuclei Enhanced by Polarization Transfer (INEPT) method.

Figure 11:
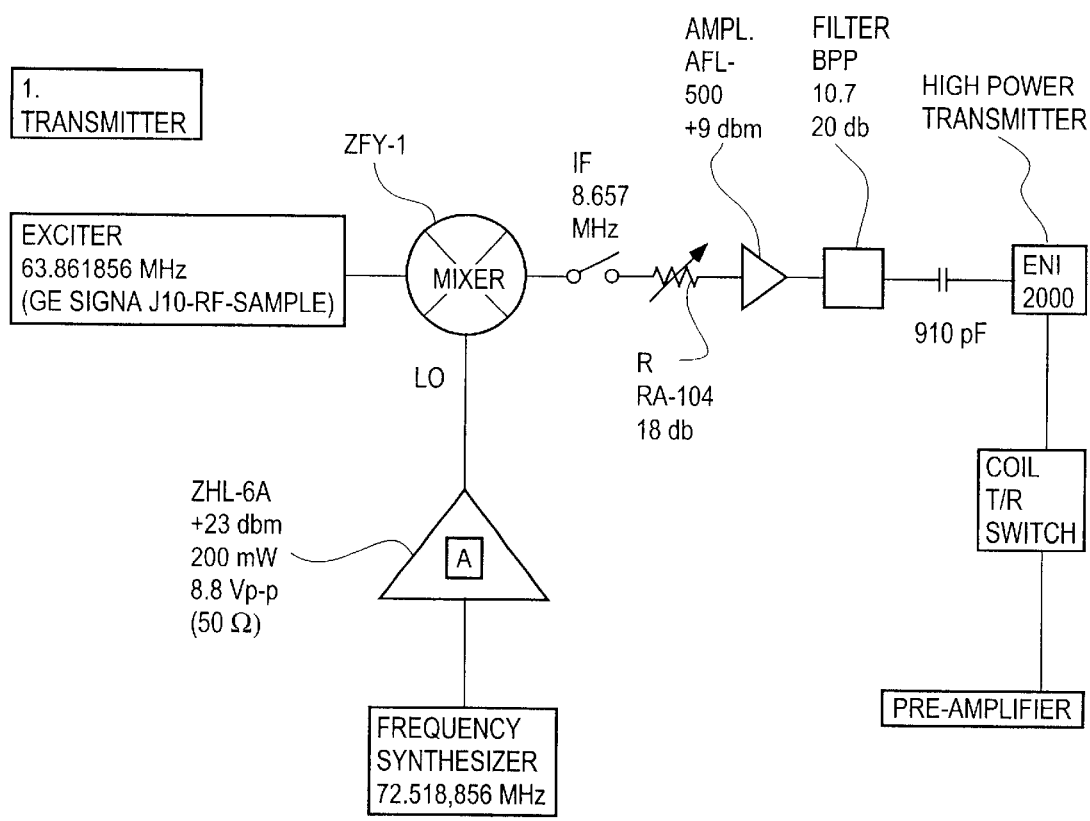
FIG. 11 is a block diagram of a transmitter portion of the transceiver of FIG. 1.
Figure 12:
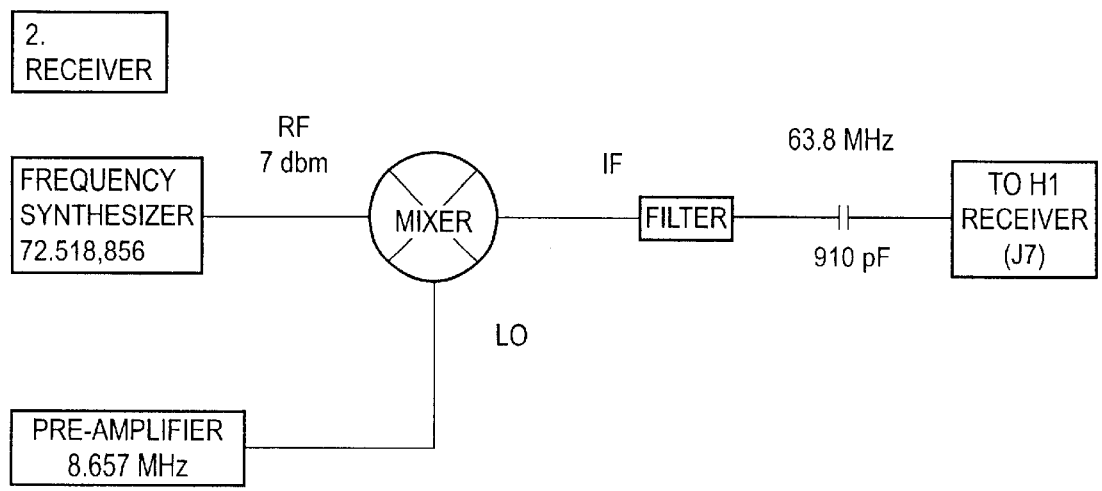
FIG. 12 is a block diagram of a receiver portion of the transceiver of FIG. 1.
Figure 13:
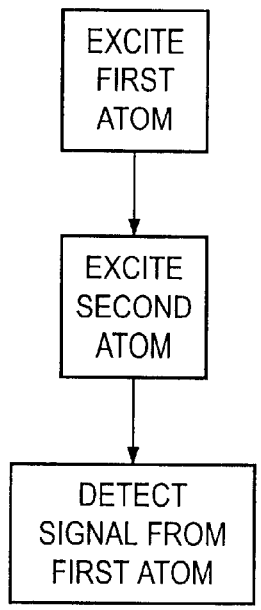
FIG. 13 is a flow chart of signal detection in accordance with an illustrated embodiment of the invention.
Figure 14:
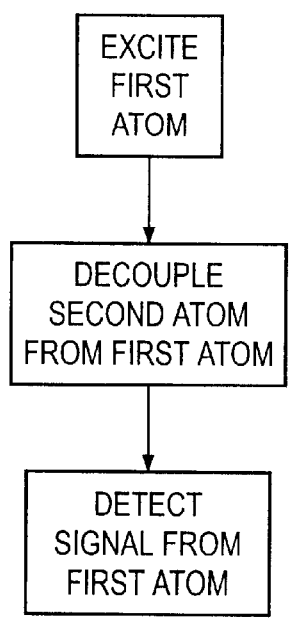
FIG. 14 is a flow chart of signal detection in accordance with an alternate illustrated embodiment of the invention.

FIGS. 11 and 12 provides an example of a transmitter and receiver that may be used for multiple irradiation of spin-coupled atoms (e.g., hydrogen-1 and oxygen-17 double irradiation in a clinical imager). The oxygen-17 frequency is generated from the hydrogen-1 frequency of the clinical instrument by mixing the hydrogen-1 exciter frequency (e.g., in a GE, SIGNA J10- rf sample MRI utility) with a frequency generated by a frequency synthesizer, so that either the sum or the difference of the two frequencies will equal to the Larmor frequency of the oxygen-17. Similarly on the receiver side (FIG. 12), the oxygen-17 frequency generated by the oxygen-17 nuclei is amplified by a preamplifier and mixed with a frequency generated by a frequency synthesizer to give the hydrogen-1 frequency, so that the clinical imager receiver can detect it.

The important advantage of this method is that it allows the use of all pulse sequences available in the clinical mode of the clinical imager.

The following variations are possible. Instead of using two frequency synthesizers, one for the transmitter branch and one for the receiver branch, one frequency synthesizer can be used. Eliminating one frequency synthesizer reduces the costs of the instrument. Instead of the frequency synthesizer a power splitter may be used which splits the frequency synthesizer power into the transmitter and receiver branches. The advantage of the use of two frequency synthesizers is that it allows a user to vary the frequencies of the transmitter and the detected signal independently, which is important in some of the double irradiation studies. Instead of using the clinical imager rf exciter frequency, a separate rf source may be used, which is a frequency synthesizer, now operating at the oxygen-17 frequency. A pulse programmer, analog or preferably digital may be used to generate the required pulse sequence.

Two options are then possible. First an oxygen-17 signal may be detected as described above. Alternatively the oxygen-17 signal may be detected using two analog to digital (A/D) converters instead of the one that is used by the clinical imager. The great advantage of this method is that it allows the user to combine the clinical available pulse sequences to be used for hydrogen with any desired pulse sequence generated by the dedicated pulse programmer. The great advantage of using two A/D converters is that it enhances the signal to noise ratio for the following reasons. First, the use of a dedicated receiver eliminates the losses of signal at each stage of mixing, because each stage of mixing involves the loss of 50% of the signal. As in the clinical instrument there are several stages of mixing. The enhancement of the signal to noise is much higher by a factor of two due to the elimination of the mixing stages.

The use of two analog to digital converters enhances the signal by a factor of two, because the use of one analog to digital converter involves the loss of 50% of the signal. The combined signal to noise ratio enhancement thus exceeds the factor of 4.

It is important to note that the method is not limited to oxygen-17 and hydrogen-1 but is applicable to any nucleus. Also the method is not limited to double irradiation studies but can be used for multi-irradiation studies and there is no limit to the number of nuclei that can be studied.

Once the first and second atoms have been decoupled, a resonance signal from either atom may be used for imaging. Alternatively, signals from both atoms may be collected simultaneously and images may be provided either separately, or as a composite.

It may be assumed that the rf pulses are applied in the x, y directions and the static magnetic field $H_o$ exists in the z-direction. The top line, I, depicts an irradiation pulse sequence for hydrogen. The bottom line S depicts an irradiation pulse sequence for oxygen-17. The wide center pulses (in both I and S lines) represent a spin rotation angle of $\pi$ and the narrower pulses represent a spin angle of $\pi/2$. Following the $\pi/2$ rf pulse at the Larmor frequency of oxygen-17, the FID signal is shown.

Figure 5:
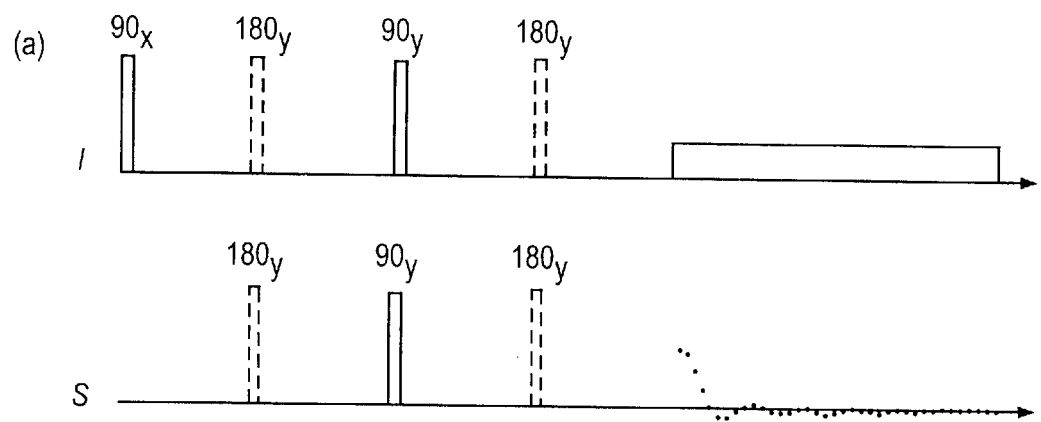
FIG. 5 depicts an alternate INEPT imaging sequence used by the system of FIG. 1.
Figure 8:
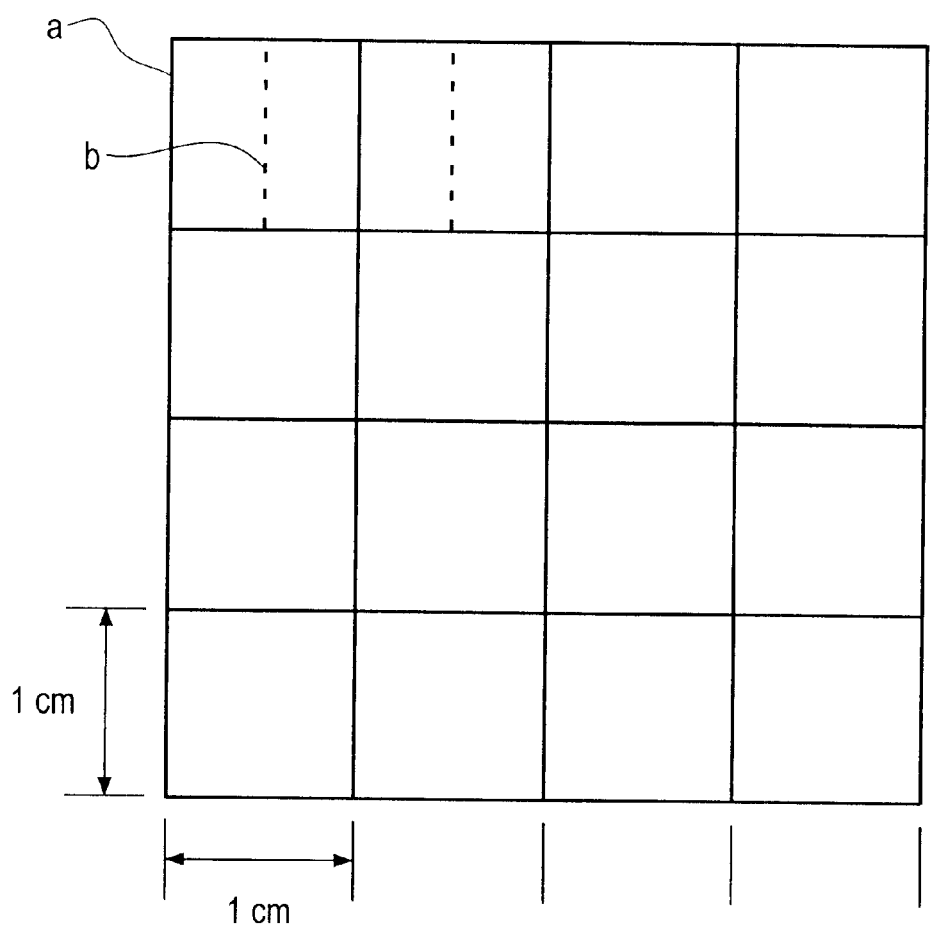
FIG. 8 depicts an imaging grid used by the system of FIG. 1.

As an alternative, the INEPT pulse sequence of FIG. 5 may be used. This sequence achieves the transfer of hydrogen spin polarization with reference to the oxygen spins.

Polarization transfer from the oxygen-17 to the hydrogen and detection of a FID signal from the hydrogen may be achieved by the INEPT sequence shown in FIG. 6. Incoherent transfer of hydrogen spin polarization to the oxygen spins is accomplished by means of the Overhauser effect (resulting from the initial continuous irradiation of the hydrogen spins). After oxygen spin evolution, the polarization of the oxygen is transferred coherently back to the hydrogen spins. Note that the hydrogen spin signal is detected under oxygen spin decoupling.

Decoupling may also be accomplished under Distortionless Enhancement by Polarization Transfer (DEPT), as shown in FIG. 7. As above, oxygen is the line labeled S and hydrogen by the line labeled I. The wide rf pulses are representative of a $\pi$ spin rotation angle, and the narrow rf pulses of a $\pi/2$ rotation angle. The $\beta$ rf pulse provides a variable rotation angle.

Under the embodiment, a direct or indirect method of irradiation may be used. The indirect method is similar to the direct method with the difference that the hydrogen signal is detected following irradiation of the oxygen-17. The hydrogen signal may be excited by either hard or soft, slice selective pulses. During and/or following the hydrogen irradiation, oxygen-17 irradiation is applied. This irradiation now serves to decouple the hydrogen from the oxygen. The hydrogen signal in the absence of the oxygen 17 irradiation is broadened due to the spin-spin coupling between the hydrogen and the oxygen. The oxygen-17 irradiation induces fast transitions between the hydrogen spin states and averages out the effect of the hydrogen/oxygen-17 spin coupling. The hydrogen signal that was broadened due to the oxygen-17/hydrogen spin-spin coupling is now decoupled, its width reduces and its height increases (in the frequency domain) and as a result, the hydrogen signal intensity increases.

The enhancement effect is significant around pH=7 which is very close to physiological pH (7.4). The reason that the enhancement effect is significant around pH=7 is that the protolysis rate of the water molecule is the slowest around pH=7. At higher or lower pH values, the rate of protolysis is high enough to significantly average out the double irradiation spin-spin coupling effects and consequently the double irradiation effect becomes small relative to the protolysis effect. This is true for both the direct and indirect methods.

Enhancement of oxygen-17 and hydrogen-1 signal intensity by double irradiation serves as a means for 1) enhancing the accuracy of determination of rCMRO$_2$ and rCBF and 2) determination of rCMRO$_2$ and rCBF by $^1$H MRI and 3) to determine tissue pH in vivo, non-invasively and in vitro. The double irradiation methods are applicable to broadband coupling and polarization transfer methods. Polarization methods include both INEPT and DEPT.

Signal enhancement for broadband coupling may be roughly equivalent to the ratio between the line width in the absence of double irradiation to the line width in the presence of double irradiation. Signal enhancement using polarization transfer methods under optimal conditions reaches a factor of 7.38. Enhancement of $^{17}$O image resolution by $^{17}$O/$^1$H double irradiation serves as a means for enhancing the resolution of determination of rCMRO$_2$ and rCBF.

The indirect method of detection of oxygen-17 magnetic resonance images by observing the oxygen-17 irradiation effect on the hydrogen image enhances the image resolution by a factor of 7.38, relative to the direct method of detection, in each dimension. The enhancement of the pixel resolution is 55.5 (i.e., 7.38$^2$), and the enhancement of the voxel resolution is 402 (i.e., 7.38$^3$). The double irradiation method can be applied to any two spin-spin coupled nuclei. The resolution enhancement in each dimension will be equal to the ratio of the gyromagnetic ratios of the two nuclei. The pixel resolution enhancement will be equal to the square of this ratio and the voxel enhancement equal to the third power of the ratio.

Enhancement of oxygen-17 image resolution may be accomplished by varying the irradiation frequency by incremental steps smaller than the Larmor frequency difference associated with pixel size (in 2D) or voxel size (in 3D). The images consist of intensities at each pixel (in 2D image) or intensities at each voxel (in 3D image). Images are thus obtained that are shifted one relative to the other in frequency. The shift in frequency corresponds to a shift in the image plane (in 2D image) or to a shift in image volume element (in 3D image). For each frequency we thus get a set of intensities shifted in space in an amount dependent on the shift in frequency. If the frequency shift is smaller than the frequency difference that corresponds to one pixel or one voxel, it provides information about the distribution of intensities within the pixel or voxel. The intensities of pixels or voxels smaller than the original pixels can thus be calculated. One can vary the frequency in steps of 1 Hz. The oxygen-17 frequency that corresponds to 1 Gauss is 577 Hz. Therefore for an MRI system with a maximum gradient of 1 Gauss per cm and a resolution of 1 cm, the resolution can be increased by a factor of 577, if steps of 1 Hz are taken. An MRI system with a maximum value of 2 Gauss per cm, and a resolution of 0.5 cm per Gauss would produce identical results. The absolute final resolution is twice as high. The hydrogen frequency corresponds to 4258 Hz per cm and therefore if steps of 1 Hz are taken, the resolution of hydrogen is enhanced by a factor of 7.38 over that of the oxygen-17.

As an example of the direct method, a determination of regional cerebral metabolism rate of oxygen consumption (rCMRO$_2$) may be made. A man may inhale normal air. MRI images of oxygen are taken every minute both with and without hydrogen irradiation for a period of ten minutes. Difference images are generated with and without hydrogen irradiation. From the difference between the oxygen-17 with hydrogen irradiation and oxygen-17 without hydrogen irradiation, brain tissue pH may be calculated pixel by pixel or voxel by voxel.

Next, air containing 21% oxygen and 79% nitrogen is inhaled for a period of ten minutes. The oxygen contains 85% oxygen-17. Every 30 seconds an MRI scan is taken both with and without hydrogen irradiation. The difference in signal intensity, pixel by pixel or voxel by voxel is calculated and recorded.

A washout period may be imposed. Normal air may be inhaled. Images of oxygen-17 are taken every minute both with and without hydrogen irradiation. Differences with and without irradiation are generated.

Two complementary methods of calculation may be used. From the time dependence of the difference between the oxygen-17 signal during hydrogen irradiation and without hydrogen irradiation cerebral metabolism rate of oxygen may be calculated. From the difference during the washout period, cerebral blood flow may be calculated. A theoretical curve may be fitted to the experimental data to provide cerebral metabolism rate of oxygen and cerebral blood flow pixel by pixel or voxel by voxel depending upon whether planar or 3D imaging was used. From the background measurement, brain tissue pH may be calculated pixel by pixel or voxel by voxel depending upon the imaging mode.

A determination of regional cerebral metabolism rate of oxygen may also be made using the indirect method. During a background period, a man may inhale normal air while images of hydrogen with and without irradiation of oxygen-17 are made every ten minutes. Differences between the presence and absence of oxygen-17 irradiation are calculated and recorded. From the differences in the images, brain tissue pH may be determined in vivo or in vitro.

Air containing 21% oxygen and 79% nitrogen are inhaled for a period of ten minutes. The oxygen contains 85% oxygen-17. Every 30 seconds a hydrogen MRI scan is taken both with and without oxygen-17 irradiation. Difference images are generated.

A washout period follows. Normal air is inhaled. Images of hydrogen are taken every minute both with and without oxygen-17 irradiation. Difference images are generated.

From the time dependence of the difference between the oxygen-17 signal with and without hydrogen irradiation a cerebral metabolism rate of oxygen is calculated and from the difference during the washout period, cerebral blood flow is calculated.

A theoretical curve may be fitted to the experimental data to determine cerebral metabolism rate of oxygen and cerebral blood flow. From the background measurement, brain tissue pH is calculated.

Under another method, from the time dependence of the difference image between the hydrogen signal with and without oxygen-17 irradiation during the inhalation period, cerebral metabolism rate pf oxygen is calculated and from the difference during the washout period, cerebral blood flow is calculated. Experimental data is fitted to a theoretical curve to generate values of cerebral metabolism rate of oxygen and cerebral blood flow. From the background measurement tissue pH is calculated in vivo or in vitro.

To determine pH, a man inhales normal air. Images of oxygen are taken every minute both with and without hydrogen irradiation for a period of ten minutes. The difference between the oxygen-17 image with and without hydrogen irradiation provides a measurement of the tissue pH in the tissue organs.

Figure 10A:
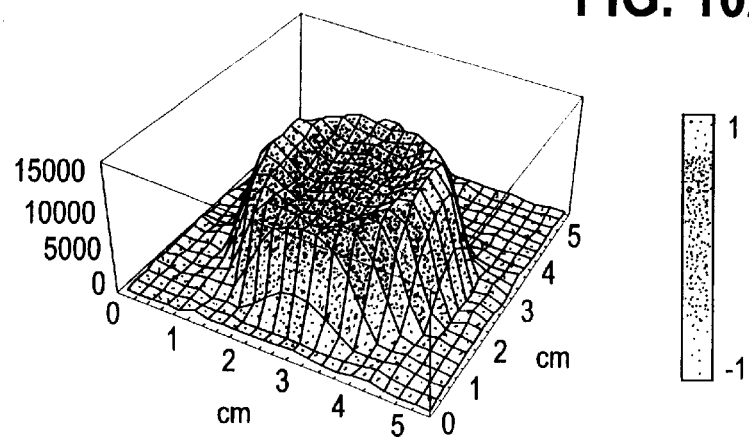
FIGS. 10a–c depict image planes with and without decoupling.
Figure 10B:
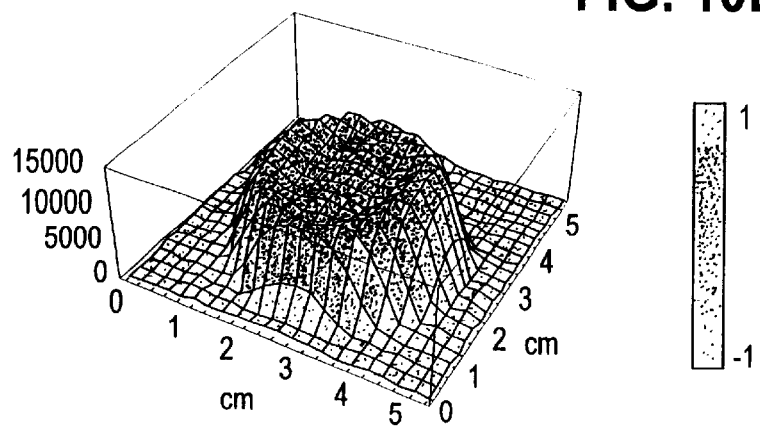
Figure 10C:
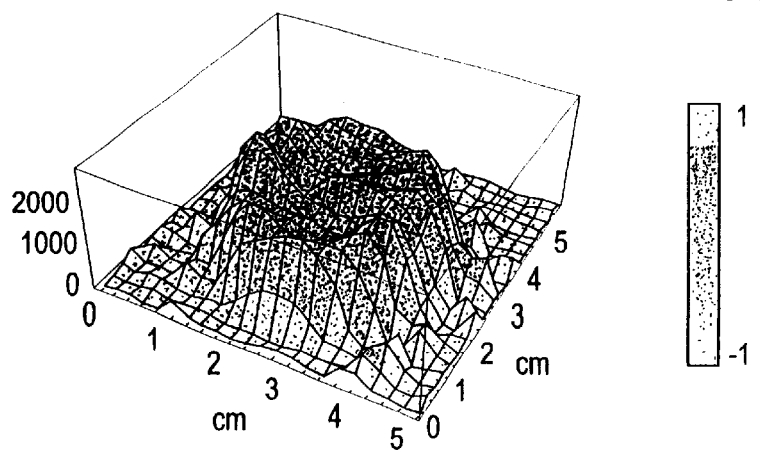

FIGS. 9a–c depicts an MRI image without decoupling. FIGS. 9d–f depict the same image and the enhancements due to decoupling. FIG. 10a depicts signal level of an image plane using decoupling. FIG. 10b depicts the same plane without decoupling. FIG. 10c is a difference plane where the values of FIG. 10b are subtracted from the values of FIG. 10a.

A specific embodiment of a method and apparatus of performing MRI measurements according to the present invention has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention any and all modifications, variations, or equivalents that fall within the true spirit and scope of the basic underlying principles disclosed and claimed herein.

What is claimed is:

1. A method of enhancing a signal quality from a first atom of a pair of spin-spin coupled atoms of a water molecule, in a magnetic resonance imaging system, such method comprising the steps of:

exciting the first atom of the pair of spin-spin coupled atoms of the water molecule within the magnetic resonance imaging system at a Larmor frequency of the first atom:

exciting the second atom at the Larmor frequency of the second atom; and detecting a signal from the first atom.

2. The method as in claim 1 further comprising sequentially exciting the first and second atoms.

3. The method as in claim 2 further comprising exciting the first atom before the second atom.

4. The method as in claim 1 further comprising simultaneously exciting the first and second atoms.

5. The method as in claim 1 further comprising detecting a signal from the second atom.

6. The method as in claim 1 wherein the step of detecting a signal from the first atom further comprises measuring a free induction decay following excitation of the first and second atoms.

7. The method as in claim 6 further comprising measuring the free induction decay using projection reconstruction of hard pulses.

8. The method as in claim 6 wherein the step of measuring the free induction decay further comprises determining a three-dimensional location of the measurement of free induction decay.

9. The method as in claim 8 wherein the step of determining a three-dimensional location of the measurement of free induction decay further comprises combining a plurality of such measurements to produce an image.

10. The method as in claim 1 further comprising repeating the step of exciting the first atom of the pair of spin-spin coupled atoms within the magnetic resonance imaging system at a Larmor frequency of the first atom.

11. The method as in claim 10 further comprising detecting a signal from the first atom without exciting the second atom.

12. The method as in claim 11 wherein the step of detecting the signal from the first atom without exciting the second atom further comprises measuring a free induction decay of the first atom without exciting the second atom.

13. The method as in claim 12 further comprising comparing a Fourier transform of the measured free induction decay following excitation of the first and second atoms with the measured free induction decay of the first atom without exciting the second atom to provide a Fourier transformed difference value.

14. The method as in claim 13 further comprising defining the Fourier transformed difference value as a measure of pH.

15. A method of enhancing a signal quality from a first atom of a pair of spin-spin coupled atoms of a water molecule, in a magnetic resonance imaging system, such method comprising the steps of:

exciting the first atom of the pair of spin-spin coupled atoms of the water molecule within the magnetic resonance imaging system at a Larmor frequency of the first atom;

decoupling the second atom from the first atom; and detecting a signal from the first atom.

16. The method as in claim 15 wherein the step of decoupling the second atom from the first atom further comprises the step of exciting the second atom at a Larmor frequency of the second atom.

17. The method as in claim 15 further comprising sequentially exciting the first and second atoms.

18. The method as in claim 17 further comprising exciting the first atom before the second atom.

19. The method as in claim 15 further comprising simultaneously exciting the first and second atoms.

20. The method as in claim 15 further comprising detecting a signal from the second atom.

21. The method as in claim 15 wherein the step of detecting a signal from the first atom further comprises measuring a free induction decay following excitation of the first and second atoms using projection reconstruction of hard pulses.

22. The method as in claim 21 wherein the step of measuring the free induction decay further comprises determining a three-dimensional location of the measurement of free induction decay.

23. The method as in claim 22 wherein the step of determining a three-dimensional location of the measurement of free induction decay further comprises combining a plurality of such measurements to produce an image.

24. The method as in claim 15 further comprising repeating the step of exciting the first atom of the pair of spin-spin coupled atoms within the magnetic resonance imaging system at a Larmor frequency of the first atom.

25. The method as in claim 24 further comprising detecting a signal from the first atom without exciting the second atom.

26. The method as in claim 25 wherein the step of detecting the signal from the first atom without exciting the second atom further comprises measuring a free induction decay of the first atom without exciting the second atom.

27. The method as in claim 26 further comprising comparing a Fourier transform of the measured free induction decay following excitation of the first and second atoms with the measured free induction decay of the first atom without exciting the second atom to provide a Fourier transformed difference value.

28. The method as in claim 27 further comprising defining the Fourier transformed difference value as a measure of pH.

* * * * *